United States Patent [19]
Russell

[11] Patent Number: 5,554,845
[45] Date of Patent: Sep. 10, 1996

[54] METHOD AND APPARATUS TO EFFECTIVELY ELIMINATE OPTICAL INTERFERENCE STRUCTURE IN DETECTOR RESPONSE

[75] Inventor: Edgar E. Russell, Goleta, Calif.

[73] Assignee: Santa Barbara Research Center, Goleta, Calif.

[21] Appl. No.: 337,720

[22] Filed: Nov. 14, 1994

[51] Int. Cl.⁶ .................................................. H01J 5/16
[52] U.S. Cl. ..................... 250/226; 250/208.2; 257/432; 359/581
[58] Field of Search ............................ 250/208.1, 208.2, 250/216, 226; 257/432, 437; 359/581, 582, 589

[56] References Cited

U.S. PATENT DOCUMENTS

| | | | |
|---|---|---|---|
| 4,401,887 | 8/1983 | Finley et al. | 250/216 |
| 4,603,945 | 8/1986 | Fergason | 350/331 R |
| 4,674,850 | 6/1987 | Blom | 350/613 |
| 5,070,230 | 12/1991 | Osada et al. | 219/203 |
| 5,350,914 | 9/1994 | Hotta | 250/208.1 |
| 5,373,261 | 12/1994 | Higgins et al. | 331/66 |
| 5,428,468 | 6/1995 | Zimmerman et al. | 359/40 |

Primary Examiner—Edward P. Westin
Assistant Examiner—Stephen Calogero
Attorney, Agent, or Firm—W. C. Schubert; W. K. Denson-Low

[57] ABSTRACT

A method and apparatus are provided to eliminate spectral interference variation contained in optical signals transmitted to an optical detector or array of optical detectors, the spectral variation deriving from the presence of a layer deposited on the detector having a different index of refraction from the detector. The practice of the invention involves optically coupling a plate to the layer using an adhesive, with the proviso that the plate, layer and adhesive have substantially the same index of refraction so that a composite thickness with the refractive index of the layer is formed. Given the inverse relationship between thickness of the layer and period of the interference in wavenumber, the effective increase in thickness of the layer yields a corresponding decrease in the period. Hence, the thickness of the plate may be selected such that the composite thickness of the layer, the plate, and the adhesive is sufficient to decrease the period so that it is masked by the normal shift of the interference structure over the range of incident angle of the optical input onto the detector or array of detectors, thereby effectively eliminating the spectral interference variation.

14 Claims, 1 Drawing Sheet

METHOD AND APPARATUS TO EFFECTIVELY ELIMINATE OPTICAL INTERFERENCE STRUCTURE IN DETECTOR RESPONSE

ORIGIN OF INVENTION

This invention was made with Government support under Contract No. FA7056-92-C-0016 awarded by the United States Air Force. The Government has certain rights in this invention.

BACKGROUND OF THE INVENTION

1. Field of the Invention

The present invention is directed to improving the optical signal transmitted to optical detectors or arrays of optical detectors, and, more particularly, to eliminating spectral variation indicating optical interference generated by the presence of a layer on the active area of an optical detector or arrays of optical detectors.

2. Description of Related Art

The clarity of optical signals transmitted to optical detectors is important, given that the distortion of these signals leads to erroneous detector responses and, consequently, erroneous interpretations of data. However, spectral distortion commonly results from the presence of layers on the active areas of detectors. Such layers may be intentionally-placed optical layers such as passivation layers or may be residual layers (such as oxide layers) accumulated as a result of numerous processing steps. Regardless of the origin or purpose of the layer, if its refractive index differs sufficiently from that of the detector material, multiple reflections at the air-to-layer and layer-to-detector interfaces will cause optical interference. This interference manifests itself as a distortion or "spectral variation" in the optical signal. Hence, the presence of a layer may adversely affect the spectral content of optical signals transmitted to the optical detector.

The problem of spectral variation is compounded when detectors are grouped together in arrays. If a thin optical layer is deposited on the individual detectors, but the thickness of the layer is not adequately controlled for uniformity across the array, the spectral responsivity of the individual detectors will differ across the array. This can significantly complicate the interpretation of the data and/or reduce the utility of the data collected due to the interaction of scene spectra variations with detector-to-detector spectral response variations.

The spectral variation caused by such layers is apparent when the detector responsivity is plotted versus wavelength. However, such spectral variation becomes nearly periodic if the responsivity is plotted versus wavenumber (wavenumber is equal to the reciprocal of the wavelength). More particularly, for a layer having a refractive index n, a thickness t, and with optical input incident at an angle of incidence $\theta'$ within the layer, the interference portion of the detector response will exhibit a periodicity in wavenumber of period $$1/(2nt \cos \theta'),$$

given constant relative refractive indices. For example, a residual oxide layer with an accumulated thickness of 2.7 $\mu m$ and a refractive index of 1.5 will result in a 0.12 $\mu m^{-1}$ periodicity, given a normal incidence, i.e., $\theta'=0°$, of the optical signal. The amplitude of the interference period is dependent on the refractive indices of the incident medium, the layer itself, and the optical detector.

Several approaches have been used to achieve a reduction in undesirable spectral variation stemming from the presence of layers on optical detectors. For example, anti-reflection coatings have been applied to such layers to reduce distortion. However, the additional processing necessary to produce an effective anti-reflection coating may be impractical or even impossible for some types of detectors. Further, an anti-reflection coating may merely reduce, but not eliminate, the spectral variation. Another approach involves making the optical layer as thin as possible such that the period is increased. While this will not eliminate the effect of the interference, it will increase the period of the interference and, for an array of detectors, will result in smaller spectral differences among detectors for a given fractional thickness variation across the array. However, such a reduction of the thickness of an optical layer may compromise other detector properties.

Thus, a need remains for a practical method to eliminate spectral variation generated by the presence of a layer on an optical detector without sacrificing detector properties. The present invention fulfills these needs.

SUMMARY OF THE INVENTION

In accordance with the invention, a method and apparatus are provided to eliminate undesirable spectral variation in the optical signal, the spectral variation having been generated by the presence of a layer on the active area of an optical detector or an array of optical detectors. More specifically, the method of the invention comprises:

(a) providing an optical detector having an active area, at least a portion of the active area being covered by a layer, the layer and the optical detector having different indices of refraction such that the layer introduces spectral variation into optical signals incident to the active area, the spectral variation having a period of interference defined by the formula $$1/(2nt \cos \theta'),$$

where n represents the index of refraction of the layer, t represents the thickness of the layer, and $\theta'$ represents the angle of incidence of the optical signals within the layer;

(b) providing a plate having an index of refraction substantially equal to the index of refraction exhibited by the layer, the plate having an areal extent at least equivalent to that of the portion of the active area covered by the layer; and (c) bonding the plate and the layer with an adhesive such that the plate is parallel to the layer across the portion of the active area covered by the layer, the adhesive having an index of refraction substantially equal to the index of refraction exhibited by the layer and the plate, wherein the thickness of the plate is selected such that the composite thickness of the layer, the adhesive, and the plate is sufficient to effectively reduce, if not eliminate, the spectral variation due to the interference within the optical layer by effectively increasing the variable t of the formula so that the period of interference is reduced according to the inverse relationship between t and period defined in the formula.

The method of the invention thus involves increasing the effective thickness of material exhibiting the index of refraction n of the layer. The inverse relationship between thickness and period of the interference versus wavenumber translates into an increasing rapid variation of the interference with wavenumber as the effective thickness of the layer is increased. Given that the interference structure shifts spectrally with angle of incidence of the optical input (as described in the equation 1/(2nt cos θ')), a plate thickness is chosen such that the shift in interference structure over the range of angle of incidence within the optical input exceeds the period of interference. Thus, the shift in interference structure masks the spectral variation and effectively eliminates its effect.

It follows that the apparatus employed in the practice of the invention comprises an optical detector having an active area at least partially covered by a spectrally-interfering layer and a plate which is bonded to the layer by an adhesive, wherein the plate, layer, and adhesive have substantially equal indices of refraction.

Advantageously, the benefits available in the practice of the invention may be realized with minimal effort and expense, requiring only the optical coupling of an appropriate optically transparent plate to the layer of concern. In fact, the method and apparatus of the invention save effort and expense in the formation of detector arrays with layers, since uniformity in the thickness of layers across arrays need not be strictly controlled. Thus, in the practice of the invention, spectral variation across an array can be effectively eliminated, rather than merely diminished, where the optical input is incident over a range of angles of incidence. Finally, the method of the invention does not require the sacrifice of any detector properties.

Accordingly, the method and apparatus of the present invention offer a practical, effective solution to the problem of spectral variation caused by the presence of layers deposited on optical detectors or arrays of optical detectors.

DETAILED DESCRIPTION OF THE PREFERRED EMBODIMENTS

The present invention is directed to effectively eliminating the spectral variation introduced in the optical signal by the presence of a layer on the active area of an optical detector or array of optical detectors.

Figure 1:
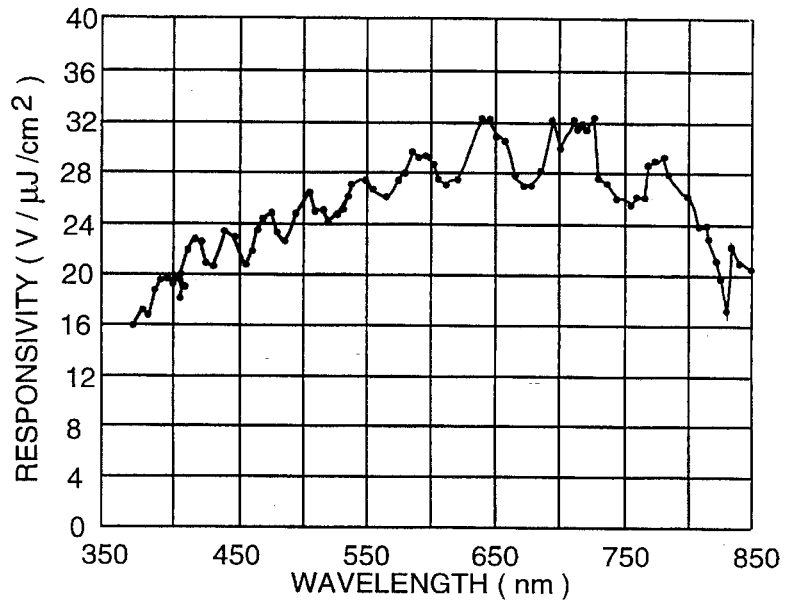
FIG. 1, on coordinates of detector responsivity (V/μJ/cm$^2$) and wavelength (nm), is a plot illustrating the spectral interference structure generated by a residual oxide layer on a prior art optical detector with the optical input incident at 0° and over a small range (~2°) angle of incidence.

The deposition of a layer on the active area of an optical device adversely affects the optical signal ultimately transmitted to the optical device if the indices of refraction for the layer and the device differ. Multiple reflections at the air-to-layer and layer-to-device interfaces introduce undesirable spectral variation into optical signals incident to the optical device. Curve 10 of FIG. 1 illustrates spectral variation due to the interference within an oxide layer on an optical device, the oxide layer having an index of refraction of about 1.5 and a thickness of about 2.7 μm. The period in wavenumber generated by a particular layer may be calculated by the formula $$1/(2nt \cos \theta'),$$

where n is the index of refraction for the layer, t is the thickness of the layer, and θ' is the angle of incidence within the layer for the optical input. Thus, the period of wavenumber for Curve 10 may be calculated to be about 0.12 μm$^{-1}$ for θ' ranging from 0° to 2°.

Figure 2:
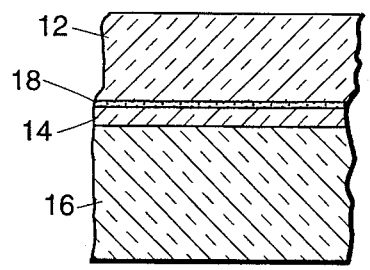
FIG. 2 is a cross-sectional view of an optical detector covered with a layer, the layer being optically coupled to a plate in accordance with the invention.

In the practice of the present invention, the thickness t is effectively increased so that the wavenumber period is accordingly decreased. More particularly, as illustrated in FIG. 2, a plate 12 is optically coupled to layer 14 deposited on optical device 16, whereby an adhesive 18 is used to bond the layer and plate such that the plate 12 is uniformly parallel to the layer 14. Both the plate 12 and the adhesive 18 are chosen to have indices of refraction substantially equal to that exhibited by the layer 14, with the indices of refraction of the plate 12, adhesive 18, and layer 14 preferably being within ±5% of each other. As a consequence, the thickness t used to calculate the period is increased from that of layer 14 alone to a composite of that layer, together with plate 12 and adhesive 18. Accordingly, in the practice of the invention, the thickness of the plate 12 is chosen so that the period is decreased sufficiently such that the spectral variation is effectively eliminated through averaging over the range of angles of incidence θ' within the optical input.

Figure 3:
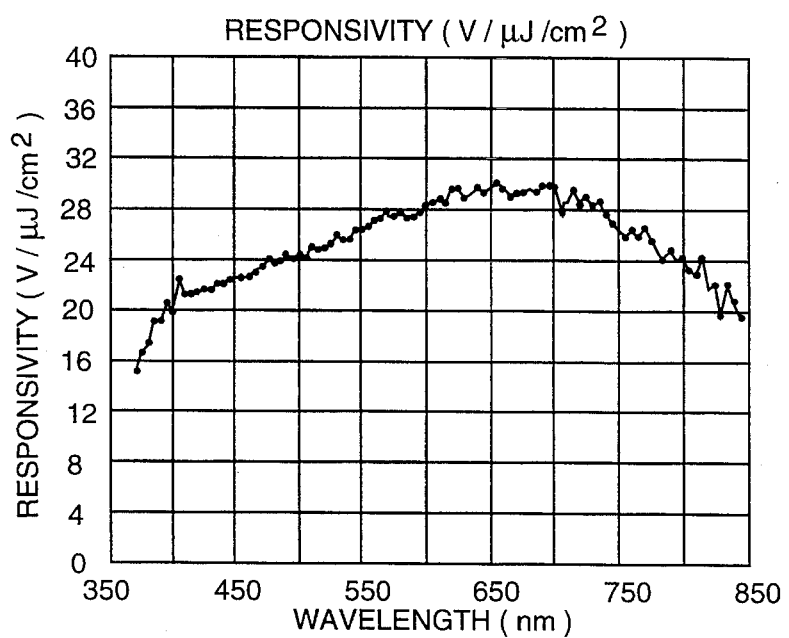
FIG. 3, on coordinates of detector responsivity (V/μJ/cm$^2$) and wavelength (nm), is a plot illustrating the results achievable with the practice of the invention, and more specifically, the near elimination of periodicity in the interference structure generated by a residual oxide layer on an optical detector when measured.

FIG. 3 illustrates a typical result achievable in the practice of the invention. More particularly, Curve 20 represents the improved spectral response achieved by effectively eliminating the spectral variation portrayed in Curve 10 of FIG. 1. The elimination of the spectral interference variation in Curve 10 is realized by optically coupling a plate 12 to the layer 14 with an adhesive 18, as portrayed in FIG. 2. The plate 12 and the adhesive 18 have indices of refraction of approximtaely 1.45 in this example (compared to 1.5 for the layer 14) and have respective thicknesses of 750 μm and 30 μm (compared to 2.7 μm for the layer 14). The composite thickness of the plate 12, layer 14, and adhesive 18 of approximately 780 μm is sufficient to reduce the period of the interference from the 0.12 μm$^{-1}$ value corresponding to the interference pattern of FIG. 1 to a period of 0.0004 μm$^{-1}$, as illustrated by the data plotted in Curve 20 of FIG. 3. The chosen thickness of the plate used to demonstrate the method will effectively eliminate the spectral interference variation at 550 nm for an equally-weighted optical input spanning the angles θ' ranging from about 0° to 2°. A large angular range will improve the effective averaging since the averaging will occur over multiple cycles, and where the averaging is over a non-integer number of cycles of interference, the residual spectral structure is minimized.

The thickness of the plate 12 necessary to effectively eliminate periodicity in an optical signal may be readily determined. For example, various thicknesses of plates 12 may be alternately bonded to a particular layer 14, so that the interference structure of these combinations may be analyzed to optimize the thickness of the plate 12 for the most complete elimination of periodicity.

The plate 12 may comprise any material that has an index of refraction substantially similar to the layer 14 of concern, possesses the necessary hardness or flexibility for the particular application, and, preferably, is optically transparent. Clear glass, which is available with a wide range of refractive indices, is a suitable material for use in the practice of the invention.

The adhesive 18 may comprise any adhesive material having an index of refraction substantially similar to that exhibited by the layer 14 and the plate 12, with the adhesive preferably being optically transparent across the wavelengths of optical signals incident to the optical detector or array of optical detectors. Other important features to consider in the choice of adhesive 18 are the degree of flexibility required, the ease of applicability, and the retention of transparency across all levels of expected optical signals. There are a number of adhesives suitable in the practice of the invention, such as Dow Corning 93–500, available from Dow Corning in Midland, Mich. For example, Dow Corning 93–500 has an index of refraction of approximately 1.45 and is preferably used in the practice of the invention given an oxide layer 14 with a similar refractive index, e.g., silicon dioxide, with the transparent plate 12 being selected to have approximately the same refractive index (e.g., fused silica). Aside from providing a close match in refractive index for many such applications, Dow Corning 93–500 retains reasonable flexibility throughout processing, does not darken at a wide range of radiation levels, and can be conveniently applied by a "wicking" process.

The process of bonding the plate 12 and the layer 14 must be carefully performed to minimize the formation of defects that may introduce distortion to the optical signals. For example, care must be taken to eliminate the formation of air bubbles within the bond.

In addition to optically coupling a plate 12 to the layer 14 to eliminate periodicity, an anti-reflection coating on the outer surface of the plate 12 may be optionally applied to increase the optical signal incident to the plate 12 as well as to reduce cross-talk and spurious response signals.

Thus, there has been disclosed a method and apparatus for effectively eliminating spectral variation introduced into optical signals incident to optical detectors and arrays of optical detectors by the presence of layers 14 on optical detectors and arrays on optical detectors. It will be readily apparent to those of ordinary skill in this art that various changes and modifications of an obvious nature may be made without departing from the spirit of the invention, and all such changes and modifications are considered to fall within the scope of the invention, as defined by the appended claims.

What is claimed is:

1. A method of fabricating a device in which spectral variation in optical signals transmitted to an optical detector or array of optical detectors is reduced, said spectral variation resulting from a layer over the active area of the optical detector or array of optical detectors, said method comprising:

(a) providing an optical detector having an active area, at least a portion of said active area being covered by a layer, said layer and said optical detector having different indices of refraction such that said layer introduces spectral variation into optical signals incident to said active area, said spectral variation having a period of interference defined by the formula $$1/(2nt \cos \theta'),$$

where n represents the index of refraction of said layer, t represents the thickness of said layer, and $\theta'$ represents the angle of incidence of said optical signals within said layer;

(b) providing a plate having an index of refraction substantially equal to the index of refraction exhibited by said layer, said plate having an areal extent at least equivalent to that of said at least a portion of said active area covered by said layer; and (c) bonding said plate and said layer with an adhesive such that said plate is parallel to said layer across said at least a portion of said active area covered by said layer, said adhesive having an index of refraction substantially equal to the index of refraction exhibited by said layer and said plate, whereby said bonding forms a structure having a composite thickness comprising the thicknesses of said plate, said adhesive, and said layer, said structure having an index of refraction substantially equal to said index of refraction n of said layer, such that the variable t of said formula is effectively increased and said period of interference is reduced according to the inverse relationship between t and period defined in said formula.

2. The method of claim 1 wherein said indices of refraction of said layer, said plate, and said adhesive are within ±5% of each other.

3. The method of claim 1 wherein said layer comprises an oxide layer.

4. The method of claim 1 wherein said plate comprises an optically transparent material.

5. The method of claim 4 wherein said optically transparent material comprises glass.

6. The method of claim 1 wherein said adhesive comprises an optically transparent material.

7. The method of claim 1 further comprising coating said plate with an anti-reflection coating, said anti-reflection coating covering at least a portion of said active area.

8. An apparatus in which spectral variation is substantially reduced in optical signals transmitted to an optical detector or array of optical detectors, where the spectral variation results from a layer over the active area of the optical detector or array of optical detectors, comprising:

(a) an optical detector having an active area, at least a portion of said active area being covered by a layer, said layer and said optical detector having different indices of refraction such that said layer introduces spectral variation into optical signals incident to said active area, said spectral variation having a period of interference defined by the formula $$1/(2nt \cos \theta'),$$

where n represents the index of refraction of said layer, t represents the thickness of said layer, and $\theta'$ represents the angle of incidence within said layer of said optical signal; and (b) a plate having an areal extent at least equivalent to that of said at least a portion of said active area covered by said layer, said plate bonded to said layer with an adhesive such that said plate is parallel to said layer across said at least a portion of said active area covered by said layer, said adhesive and said plate having indices of refraction substantially equal to the index of refraction exhibited by said layer, wherein said layer, said plate, and said adhesive comprise a structure having a composite thickness and an index of refraction substantially equal to said index of refraction n of said layer, such that the variable t of said formula is effectively increased from said thickness of said layer to said composite thickness, such that said period of interference is reduced according to the inverse relationship between t and period of interference defined in said formula.

9. The apparatus of claim 8 wherein said indices of refraction of said layer, said plate, and said adhesive are within ±5% of each other.

10. The apparatus of claim 8 wherein said layer comprises an oxide layer.

11. The apparatus of claim 8 wherein said plate comprises an optically transparent material.

12. The apparatus of claim 11 wherein said optically transparent material comprises glass.

13. The apparatus of claim 8 wherein said adhesive comprises an optically transparent material.

14. The apparatus of claim 8 further comprising coating said plate with an anti-reflection coating, said anti-reflection coating covering at least a portion of said active area.

* * * * *